United States Patent

Eldridge et al.

[11] Patent Number: 5,912,046
[45] Date of Patent: Jun. 15, 1999

[54] METHOD AND APPARATUS FOR APPLYING A LAYER OF FLOWABLE COATING MATERIAL TO A SURFACE OF AN ELECTRONIC COMPONENT

[75] Inventors: Benjamin N. Eldridge, Danville; Igor Y. Khandros, Orinda; Gaetan L. Mathieu, Livermore, all of Calif.

[73] Assignee: Form Factor, Inc., Livermore, Calif.

[21] Appl. No.: 08/854,203

[22] Filed: May 9, 1997

Related U.S. Application Data

[63] Continuation-in-part of application No. 08/554,902, Nov. 9, 1995, application No. PCT/US95/14844, Nov. 13, 1995, application No. 08/452,255, May 26, 1995, application No. PCT/US95/14909, Nov. 13, 1995, said application No. 08/452,255, and application No. PCT/US95/14909, each is a continuation-in-part of application No.08/340,144, Nov. 15, 1994, and application No. PCT/US94/13373, Nov. 16, 1994, said application No. 08/340,144, and application No. PCT/US94/13373, each is a continuation-in-part of application No.08/152,812, Nov. 16, 1993, Pat. No. 5,476,211.

[51] Int. Cl.⁶ ...................................................... B05D 5/12
[52] U.S. Cl. ........................ 427/126.2; 118/500; 427/240
[58] Field of Search ........................... 427/96, 240, 126.2; 118/500

[56] References Cited

U.S. PATENT DOCUMENTS

| | | | |
|---|---|---|---|
| 5,264,246 | 11/1993 | Ikeno | 427/240 |
| 5,348,615 | 9/1994 | Gupta | 156/635 |
| 5,449,644 | 9/1995 | Hong et al. | 148/DIG. 133 |
| 5,476,211 | 12/1995 | Khandros | 228/180.5 |
| 5,639,325 | 6/1997 | Stevens et al. | 427/96 |
| 5,714,417 | 2/1998 | Kung | 438/626 |

*Primary Examiner*—Michael Lusignan
*Attorney, Agent, or Firm*—David Larwood; Gerald Linden

[57] ABSTRACT

A flowable coating material, such as a liquid having solids in suspension, such as spin-on glass, is applied to a surface of an electronic component by placing the component in a centrifuge and spinning the component about a first axis so that the liquid material is forced against the surface of the component. The component may also be rotated about its own axis so that the liquid material is distributed along the surface of the component.

16 Claims, 4 Drawing Sheets

METHOD AND APPARATUS FOR APPLYING A LAYER OF FLOWABLE COATING MATERIAL TO A SURFACE OF AN ELECTRONIC COMPONENT

CROSS-REFERENCE TO RELATED APPLICATIONS

This patent application is also a continuation-in-part of commonly-owned, copending U.S. patent application Ser. No. 08/554,902 filed Nov. 9, 1995 and its counterpart PCT patent application No. PCT/US95/14844 filed Nov. 13, 1995, both of which are incorporated by reference herein.

This patent application is also a continuation-in-part of commonly-owned, copending U.S. patent application Ser. No. 08/452,255 (hereinafter "PARENT CASE") filed May 26, 1995 and its counterpart/PCT patent application number PCT/US95/14909 filed Nov. 13, 1995, both of which are continuations-in-part of commonly-owned, copending U.S. patent application Ser. No. 08/340,144 filed Nov. 15, 1994 and its counterpart PCT patent application number PCT/US94/13373 filed Nov. 16, 1994, both of which are continuations-in-part of commonly-owned, U.S. patent application Ser. No. 08/152,812 filed Nov. 16, 1993 (now U.S. Pat. No. 5,476,211, Dec. 19, 1995), all of which are incorporated by reference herein.

TECHNICAL FIELD OF THE INVENTION

The present invention relates to techniques for applying a flowable coating materials, such as spin-on glass to a surface of an electronic component and, more particularly, to applying such flowable coating materials to a surface of an electronic component that has a number of microstructures disposed on its surface.

BACKGROUND OF THE INVENTION

There is an established need in the electronics industry to apply layers of flowable coating materials such as spin-on glass to the surface of electronic components. As used herein, "flowable coating materials" includes:

spin-on glass, which is a suspension of glass particulates in a liquid, such as water or a solvent;

polymers such as silicones, polyimides, polyamides, and epoxy; and melts (melted materials, including metals and plastics).

It is known in the prior art to apply a layer of spin-on glass to a surface of an electronic component by mounting the component on a turntable so that its surface is horizontal and, while rotating the turntable about a vertical axis, dispensing the spin-on glass (e.g., as a dollop of material) onto the surface of the component. The rotation of the turntable (platen) exerts a horizontal rotational force on the spin-on glass which is parallel to the surface of the component. Adhesion and process limitations (e.g., terminating the process) prevents all of the flowable coating material from spinning off of the device. It should be noted that, in this prior art process, the axis of rotation is normal to the surface of the component and is in a vertical direction (pointing at the center of the earth).

Spinning on flowable coating materials in the aforementioned manner is generally effective, unless there are "obstacles" (microstructures) on the surface of the electronic component which either directly or indirectly prevent the glass material from spreading across the surface of the component. Additionally, when a plurality of microstructures are closely spaced on the surface of the component, there will be a tendency for the flowable coating material to "creep" up between adjacent microstructures. The present invention provides method and apparatus for overcoming these limitations.

Reference is made to commonly-owned U.S. patent application Ser. No. 08/152,812 filed Nov. 16, 1993 (now U.S. Pat. No. 4,576,211, issued Dec. 19, 1995), and its counterpart commonly-owned copending "divisional" U.S. patent applications Ser. Nos. 08/457,479 filed Jun. 01, 1995 (status: pending) and 08/570,230 filed Dec. 11, 1995 (status: pending), all by KHANDROS, disclose instances wherein an electronic component has a plurality of free-standing elongate interconnection elements (microstructures, obstacles) mounted to its surface and protruding therefrom. These interconnection elements, may each measure on the order of a few mils in diameter and be spaced only a few mils apart, and may benefit (mechanically) from having a layer of glass material disposed at their bases. Generally, any liquid (flowable) material that is applied to the surface of such a component will tend to creep up (away from the surface of the electronic component) the elongate elements themselves as well as in the spaces between adjacent elongate elements due, primarily, to the forces of surface tension. These forces are of such magnitude that they can substantially prevent spin-on glass material from spreading out in the aforementioned manner along the surface of the electronic component.

What is needed is a technique for applying flowable coating materials such as spin-on glass to the surface of an electronic component that has "obstacles" on its surface, such as the aforementioned component having elongate interconnection elements protruding from its surface. The present invention is not limited to such a component, which is mentioned by way of example only.

BRIEF DESCRIPTION OF THE INVENTION

It is an object of the invention to provide an improved technique for applying a layer of flowable coating material such as spin-on glass to a surface of an electronic component.

It is another object of the present invention to provide a technique for applying a layer of flowable coating material such as a spin-on glass to a surface of an electronic component that has "obstacles" on its surface.

According to the invention, a flowable coating material, such as a liquid having solids in suspension, such as spin-on glass, is applied to a surface of an electronic component having its surface oriented in a vertical position by placing the component in a centrifuge and spinning the component about a first axis so that the flowable material is forced ("F1") against the surface of the component. The component may also be rotated about its own axis so that the flowable material is distributed by a rotational force ("F2") along the surface of the component.

The centrifugal force ("F1") overcomes a tendency for the flowable material to creep up between adjacent microstructures on the surface of the component.

The rotational force ("F2") distributes the flowable material along the surface of the component while the component is oriented with its surface in the vertical position.

According to an aspect of the invention, the component has a plurality of microstructures, such as resilient (spring) contact elements, disposed in an area on its surface being coated, and an inner dam surrounds the area. An outer dam surrounds the inner dam. A small orifice is provided in the inner dam. The inner and outer dams cooperate to ensure that the coating material will be planar in the area, particularly when the centrifuge has a relatively small diameter, such as 14 inches.

Reference is made to the aforementioned commonly-owned, copending U.S. patent application Ser. No. 08/554,902 filed Nov. 09, 1995 and its corresponding PCT Patent Application No. PCT/US95/14844 filed Nov. 13, 1995 (WO96/15458, published May 23, 1996), both by ELDRIDGE, GRUBE, KHANDROS and MATHIEU, which discloses a probe card assembly that includes a plurality of elongate resilient (spring) contact elements mounted to a "space transformer" component. The space transformer component is an example of an electronic component that has a plurality of microstructures on its surface and that would benefit from the present invention.

A number of other of the aforementioned commonly-owned copending patent applications disclose electronic components having a plurality of microstructures on their surface, such as resilient (spring) contact elements on silicon substrates, which would also benefit from the present invention.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting.

Although the invention will be described in the context of these preferred embodiments, it should be understood that it is not intended to limit the spirit and scope of the invention to these particular embodiments.

Certain elements in selected ones of the drawings are illustrated not-to-scale, for illustrative clarity.

Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

Figure 1A:
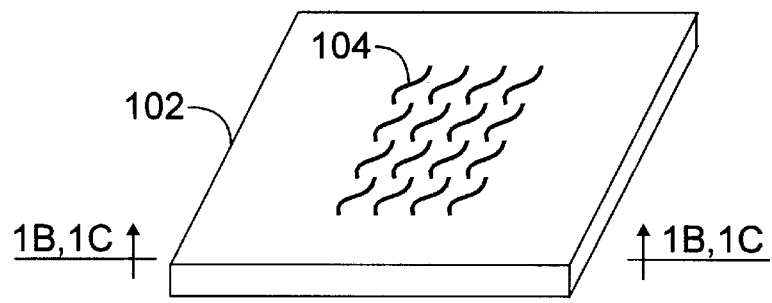

FIG. 1A is a perspective view of an electronic component (102) having a plurality of microstructures (104) on a surface thereof.

Figure 1B:
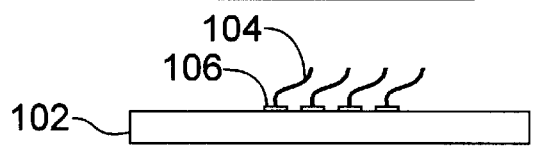

FIG. 1B is a side view of the electronic component illustrated in FIG. 1A.

Figure 1C:
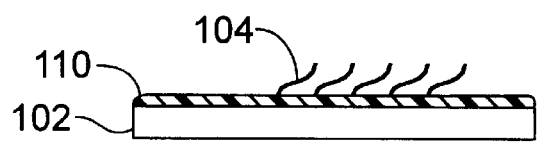

FIG. 1C is a side cross-sectional view of the electronic component illustrated in FIGS. 1A and 1B with a layer of flowable coating material disposed on its surface, according to the invention.

Figure 1D:
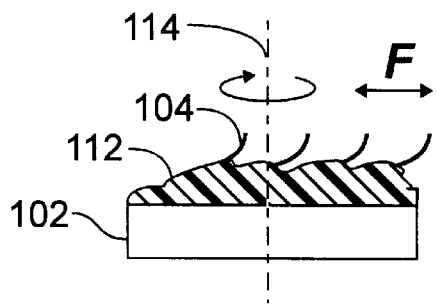

FIG. 1D is a side cross-sectional view of an electronic component having a plurality of microstructures on a surface thereof, upon which a layer of flowable coating material has been disposed, without benefit of the present invention.

Figure 2A:
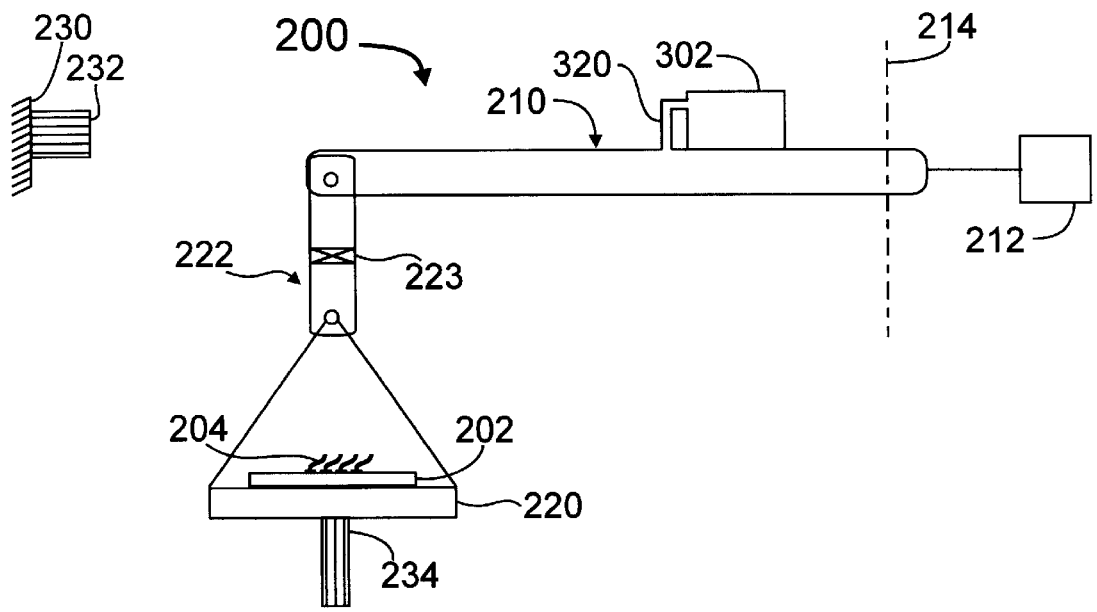

FIG. 2A is a schematic illustration of an apparatus for performing the technique of the present invention, at rest.

Figure 2B:
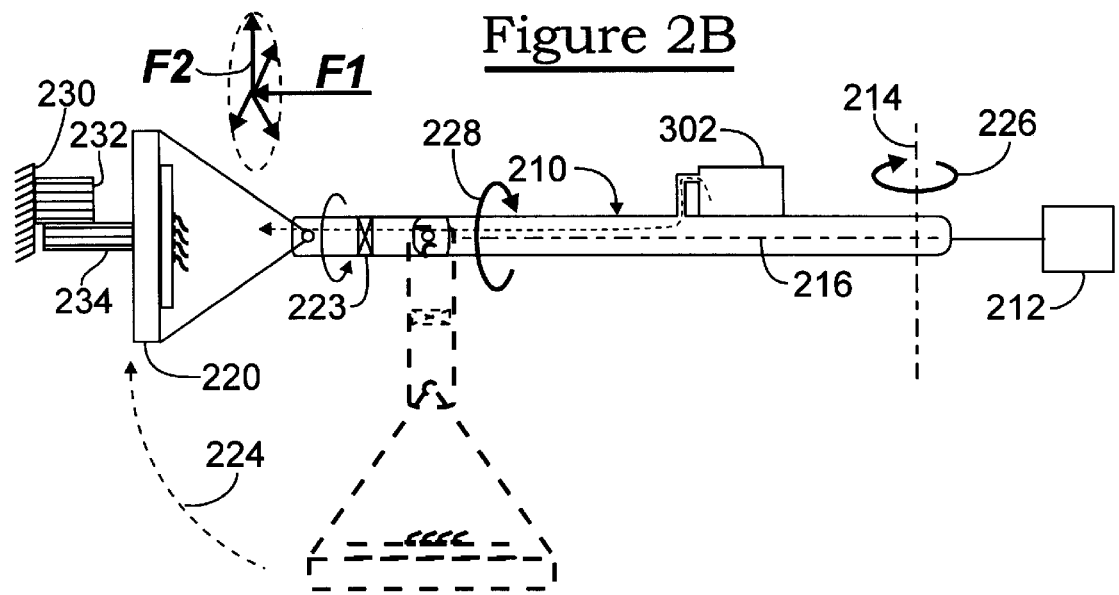

FIG. 2B is a schematic illustration of the apparatus of FIG. 2A, in use, according to the invention.

Figure 2C:
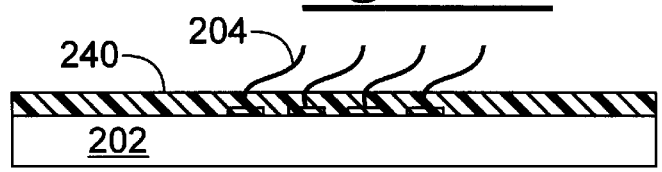

FIG. 2C (compare FIG. 1C) is a side cross-sectional view of an electronic component with a layer of flowable coating material disposed on its surface, according to the technique illustrated in FIGS. 2A and 2B, according to the invention.

Figure 3A:
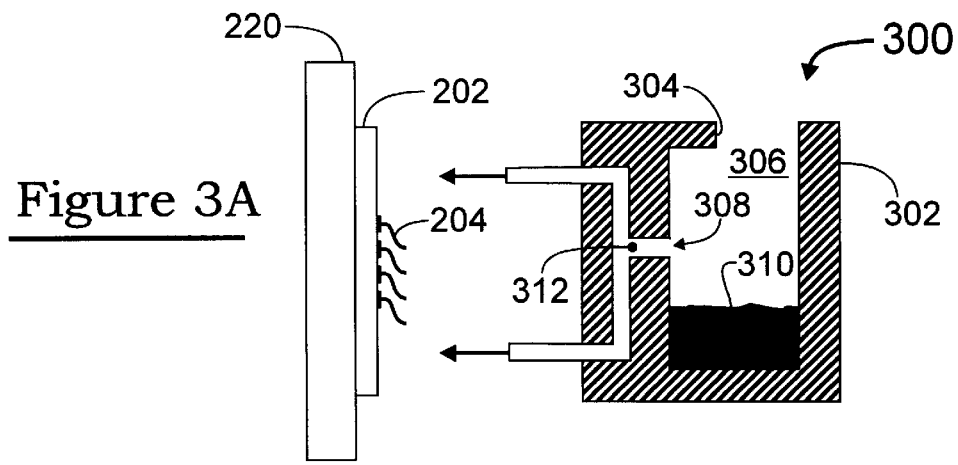
Figure 3B:
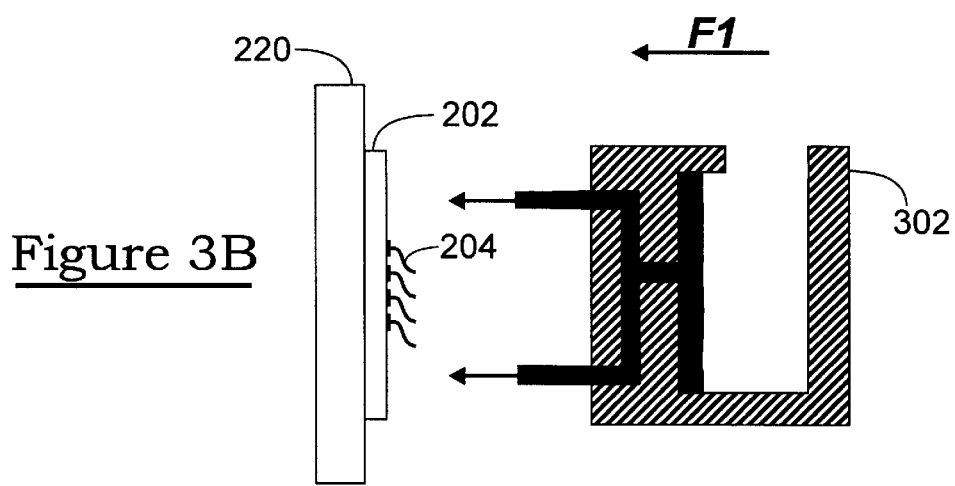
Figure 3C:
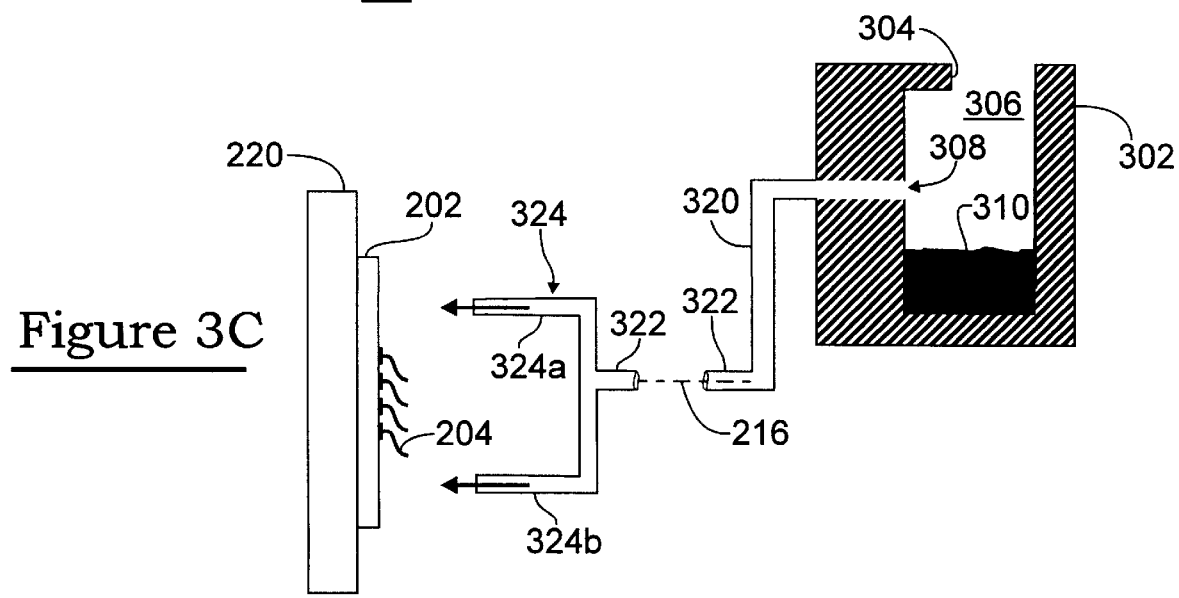

FIGS. 3A, 3B and 3C are side cross-sectional schematic views of a portion of the apparatus of FIGS. 2A and 2B, illustrating certain details of an exemplary embodiment of the present invention.

Figure 4A:
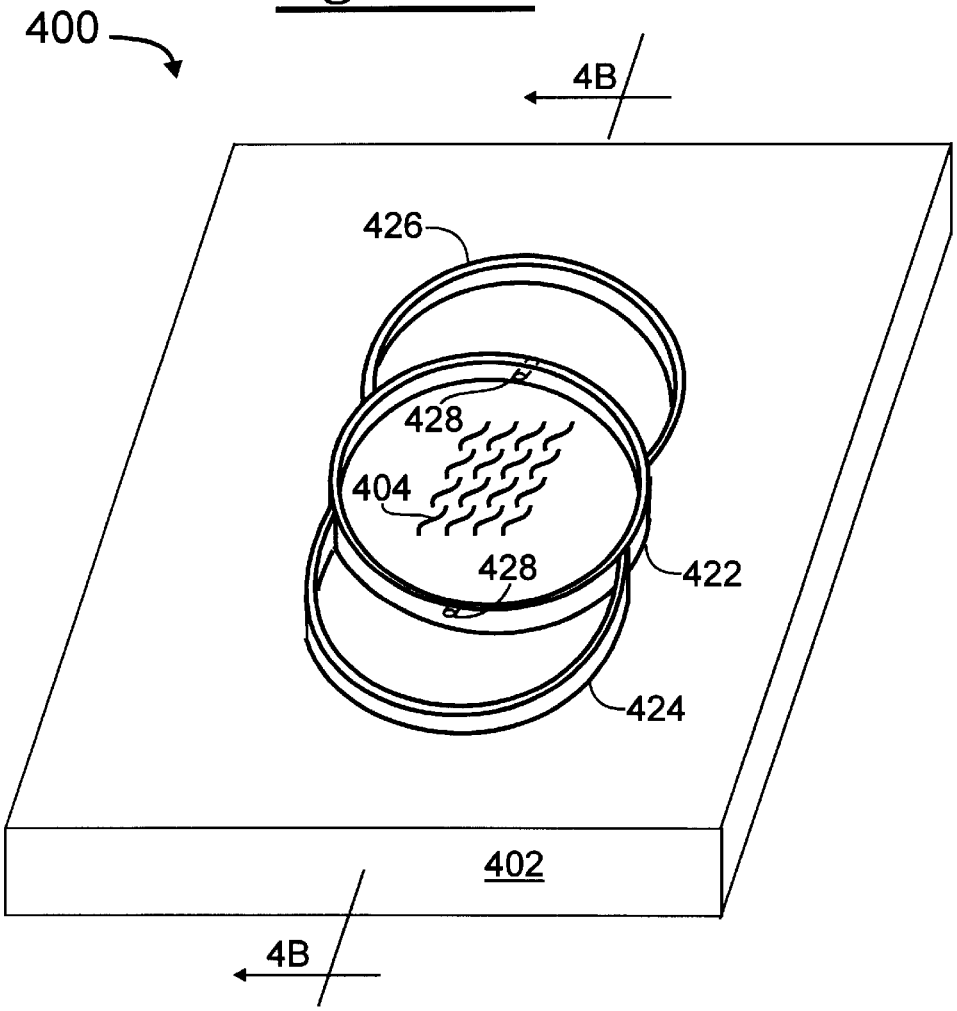
Figure 4B:
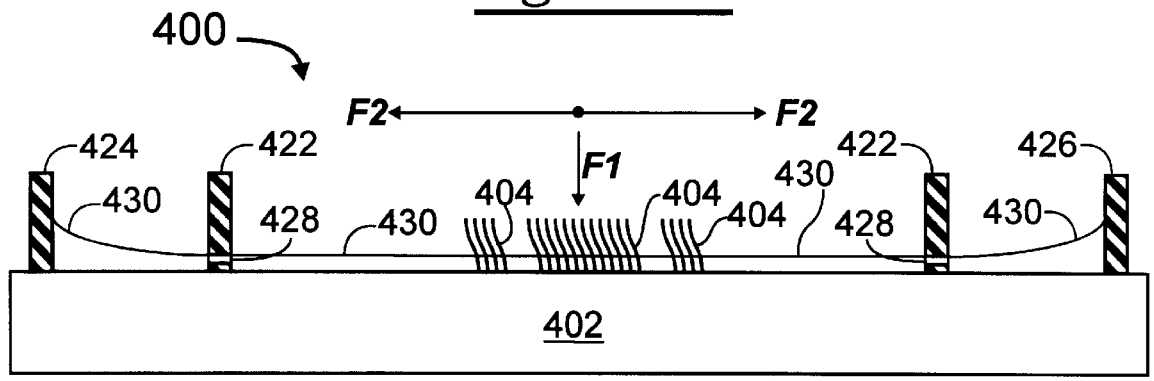

FIG. 4A is a perspective view, and FIG. 4B is a side cross-sectional view of an embodiment of the invention wherein a temporary dam structure is provided on the surface of the component being coated, according to the invention.

DETAILED DESCRIPTION OF THE INVENTION

FIGS. 1A, 1B and 1C illustrate an electronic component 102 which has a plurality of elongate elements (microstructures) 104 extending from a surface thereof, in the manner of the space transformer component of the aforementioned U.S. patent application Ser. No. 08/554,902 wherein the elongate elements 104 are resilient interconnection elements mounted by their bases to the terminals 106 on a surface of the space transformer component. In use, pressure connections are effected with terminals of another electronic component (not shown) by the free ends (top, as viewed in FIG. 1B) of the elongate interconnection elements 104. The forces (downward on the free ends, as viewed in FIG. 1B) resulting from such pressure connections will manifest themselves at the bases of the elongate elements 104. FIG. 1A shows an exemplary rectangular array of a plurality (sixteen of many shown) of elongate elements.

As best viewed in FIG. 1C, in order to augment securing the elongate elements 104 to the terminals 106, as well as to augment securing the terminals 106 to the body of the electronic component 102, it is desirable to apply a substantially uniform (i.e., substantially planar) layer of a flowable coating material such as spin-on glass material 110 onto the surface of the component 102 to a sufficient thickness that the glass material 110 will cover the terminals (106) and the base portions of the elongate elements 104. It is strongly desired that the glass material 110 does this without covering either the free ends (tops, as viewed) of the elongate elements 104 or the main body portions of the elongate elements 104. The former (covering the free ends) would impair the ability of the free ends to make electrical contact with terminals of other electronic components. The latter (covering the main body portions) would, in the case of the elongate elements being resilient (spring) contact elements, adversely impact the sought after resiliency of the elongate elements.

If one were to apply spin-on glass in the manner common to prior art, as described hereinabove, the result would be unacceptable, resulting in there being no flowable material at the middle of the surface of the component or, as is shown in FIG. 1D resulting in the glass material 112 (compare 110) creeping up the elongate elements 104 despite spinning the component 102 about a vertical axis which is normal to the surface of the component (and directed at the center of the earth). Such motion imposes a rotational force ("F") on the flowable coating material and on the component which is parallel to the surface of the component.

FIG. 2A illustrates a technique 200 for applying a flowable coating material such as spin-on glass to electronic components 202 (compare 102) having microstructures ("obstacles") such as the aforementioned elongate elements 204 (compare 104) protruding from their surface. In a general sense, the apparatus is a centrifuge with more than one degree of freedom (axes of rotation). An elongate arm 210 is provided. In use, the arm 210 can rotate about an axis 214 (compare 114) passing through an inner end of the arm 210a. A suitable (including adjustable) counterweight 212 is provided opposite (on the opposite side of the axis 214 from) the arm 210.

A basket 220 is hung (suspended) by an articulated link 222 from the outer end of the outer arm portion 210b and includes a slip coupling (bearing 223). When at rest (not rotating about the axis 214), the link 222 hangs freely from the outer end of the arm 210, as illustrated in FIG. 2A. When the arm 210 is rotating, as illustrated in FIG. 2B, the link 222 and basket 220 swing up from their at-rest position (shown in dashed lines in FIG. 2B) as indicated by the arrow 224. In this manner, the centrifugal force ("F1") applied to the electronic component 202, and to any material (e.g., a flowable coating material) applied to the surface of the electronic component, will be in a direction which is normal to the surface of the electronic component. This, as will be seen, is but a first component of a "composite force" that will act upon material applied to the surface of the electronic component. The basket 220 and link 222 constitute "means for supporting" the electronic component 202.

A second component of the composite force is a rotational force ("F2") acting upon the electronic component (and any material applied to its surface) results from rotating the basket 220 and the component 202 supported by the basket 220 in a different, orthogonal axis.

In use, the arm 210 is rotated about the axis 214, as illustrated by the arrow labelled 226, to apply a force ("F1") perpendicular to the axis 214 and normal to the surface of the component 202, the basket 220 swings up (as shown in FIG. 2B), and the outer portion 210b of the arm 210 is rotated around the longitudinal axis 216 of the arm 210 as illustrated by the arrow labeled 228 which applies a force ("F2") parallel to the surface of the component 202.

The basket 220 is suitably caused additionally (second component of its rotation) to rotate about the longitudinal (orthogonal) axis 216 in the following manner. As best viewed in FIG. 2B, an inside surface 230 of the centrifuge apparatus 200 is provided with an annular projection 232 which may be a ring of elastomeric material, or a ring gear having teeth along its bottom (as viewed) edge. A bottom surface of the basket 220 is provided with a projecting spindle 234 which, when the basket swings up into position and the arm 210 is rotating about the axis 214, interacts with the annular projection 232, thereby imparting a rotation to the basket 220. The spindle 234 is suitably a gear that meshes with the ring gear of the annular projection 232. Or, the spindle 234 is simply a cylindrical member that frictionally engages with a smooth surfaced annular projection 232. The rate of basket rotation is readily determined by the diameter of the spindle 234 and/or the resulting gear ratio, in conjunction with the rate of rotation of the arm 210. Together, the projection 232 and spindle 234 constitute "means for imparting" the rotational force "F2" which is parallel to the surface of the electronic component to the electronic component.

By applying a composite (F1 and F2) force, while dispensing the flowable coating material (e.g., spin-on glass), a superior result is achieved, as is illustrated in FIG. 2C, showing a substantially flat, uniform layer 240 of flowable coating material on the surface of the component 202 which does not "creep" up the microstructures 204. (Contrast the results obtained by the prior art, illustrated in FIG. 1D.)

In contrast to the prior art, discussed hereinabove:
the first force component "F1" is normal to the surface of the component and will force a flowable coating material (e.g., spin-on glass) dispensed upon the surface of the component onto the component, overcoming a tendency for the flowable coating material to creep up between the microstructures on the surface of the electronic component;

the second force component "F2" is similar to the force of the prior art, in that it acts parallel to the surface of the electronic component to spread a flowable coating medium across the surface of the electronic component. However, in the apparatus of the present invention the component 202 is in a vertical orientation, rather than in a horizontal orientation as in the prior art.

Having established a mechanism (apparatus) for applying forces to the electronic component, we shift our attention to a mechanism (means) for applying (delivering, dispensing) a flowable coating material, such as spin-on glass, to the surface of the component. Such a mechanism 300 for applying material is shown in FIGS. 2A, 2B, 3A and 3B.

As best viewed in FIGS. 3A and 3B, the mechanism 300 for applying a flowable coating material 310 (compare 110) includes a reservoir 302 having an opening 304 in its top (as viewed) surface for receiving the material 310 and a cavity 306 for containing the material 310 within the reservoir 302. An opening 308 is provided partway up the cavity 306 at a position that is sufficiently elevated (up, as viewed) that the cavity can contain a given amount (volume) of material 310 below (as viewed) the opening 308. FIG. 3A illustrates the mechanism 300 with the arm 210 at rest (compare FIG. 2A), wherein it can be seen that the material 310 is accumulated (as dictated by gravity) in the bottom of the cavity 306.

As best viewed in FIGS. 2A and 2B, the reservoir 302 is suitably disposed atop the inner arm portion 210b, preferably as close to the axis 214 as possible to minimize its rotational moment (i.e., mass times radius).

The opening 308 is in fluid communication with a passageway 312 that exits the side (as viewed) of the reservoir 302. In this manner, in use, when the arm 210 is rotated about the axis 214 (see FIGS. 2B and 3B), the material 310 will be forced against the side of the cavity 308 and will exit the reservoir 302 via the opening 308 and the passageway 312.

As best viewed in FIGS. 2B and 3C, the glass material is suitably delivered from the reservoir 302 to the surface of the component 202 via a piping system comprising: a pipe 320 (conduit) leading out of the side of the reservoir 302 to a pipe 322 which runs along (or within) the arm 210, to a delivery manifold 324 having, for example, two outlet orifices 324a and 324b. (More than one delivery manifold may be provided.) In use, the centrifugal force "F1" will force the material 310 out of the reservoir 302, through the piping system, and out of the outlet orifices 324a and 324b from whence it will impinge on the surface of the component 202, preferably in an area of the surface that is not populated by elongate elements 204. Together, the reservoir 302 and the piping system (320, 322, 324) constitute "means for dispensing" the flowable material (310) onto the surface of the component (202). In this manner, the flowable coating material 310 will only be dispensed when a threshold centrifugal force "F1" is achieved.

FIGS. 4A and 4B illustrate an application of the invention wherein a space transformer component 402 (compare 102, 202) such as the space transformer component of the aforementioned commonly-owned copending U.S. patent application Ser. No. 08/554,902, has a plurality of resilient (spring) contact elements 404 (compare 104, 204) mounted to a surface thereof. The spring contact elements (microstructures) 404 occupy a small area on the surface of the space transformer component, such as a central one-tenth of its surface. For example, the surface of the space transformer measures between 3"×3", and the spring contact elements 404 are in an area measuring ½"×¾". Although illustrated in a horizontal orientation, it should be understood that the component 402 is disposed in a vertical orientation while being coated in the manner described hereinabove.

A dam structure is provided on the surface of the component 402 being coated, as follows. An inner dam (interior wall) 422 is larger than and surrounds the area occupied by the spring contact elements 404 and has an exemplary diameter of 1.25". The inner dam 422 is suitably circular. An outer dam (exterior retention wall) surrounds the inner dam 422 and is shown as having two arcuate portions 424 and 426 positioned at diametrically-opposed locations with respect to the inner dam 422. The outer dam 424 could also be circular, concentric with the inner dam 422. Two small (e.g., 13 mils diameter) orifices 428 are provided in the inner dam 422 to allow flowable material 430 (compare 310) to flow from within the inner dam 422 (including the area populated by the microstructures 404) to the outer dam. These orifices 428 are located at a predetermined position above the surface of the component 402 and define the resulting (final) thickness of the flowable material 430. For example, for microstructures 404 having a height of 50 mils, the orifices 428 may be located 15 mils above the surface of the component 402.

The dam structure 422/424/426 also serves the important purpose of "compensating" for a relatively small radius of curvature in the centrifuge apparatus. For example, when dispensing flowable material onto the surface of a 3" square component in a centrifuge having a 14" diameter, the fact that the diameter of the centrifuge is not significantly (e.g., more than ten times) larger than the surface being coated will result in the coating being curved, following the curvature of the centrifuge. It is generally desired that the coating be flat, or at least reasonably so. As best viewed in FIG. 4B, the dam structure alleviates and overcomes this problem, and ensures that the coating is reasonably flat within the inner dam 422, shifting the undesired effects to the retention area between the inner and outer dams.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, a second "dummy" reservoir operating in much the same manner as the reservoir 302 can be disposed on the arm 310 to deliver material to a reservoir on or in the counterweight 212. In this manner, as material 310 is dispensed onto the component 202 and the rotational moment of the arm increases, a counterbalancing force (rotational moment) can be created. Or, two opposed arms (210) and baskets (220) and material delivery systems can be arranged on opposite sides of the axis (214) so that material can be applied to two components (202) at once, while balancing the rotational moments of the system.

What is claimed is:

1. Method of applying a layer of flowable coating material to a surface of an electronic component, comprising:
    applying a first force in a direction which is normal to the surface of the component; and
    then dispensing a flowable coating material onto the surface of the component.
2. Method, according to claim 1, wherein:
    the flowable coating material is spin-on glass.
3. Method, according to claim 1, wherein:
    the first force is applied by mounting the component to an end of a centrifuge arm with a longitudinal axis of the centrifuge arm being normal to the surface of the component.
4. Method, according to claim 1, further comprising:
    applying a second force in a direction which is parallel to the surface of th e component.
5. Method, according to claim 4, wherein:
    the second force is applied by rotating the component about an axis which is normal to its surface.
6. Method, according to claim 1, further comprising:
    dispensing the flowable coating material only when a threshold first force is applied.
7. Method of applying a layer of flowable coating material to a surface of an electronic component, comprising:
    orienting an electronic component so that a surface thereof is vertical;
    establishing a force normal to the surface of the component; and
    while rotating the electronic component about an axis which is normal to a surface of the component, dispensing a flowable coating material onto the surface of the component.
8. Method, according to claim 7, wherein:
    the flowable coating material is spin-on glass.
9. Method, according to claim 8, further comprising:
    providing an inner dam on the surface of the component, said inner dam surrounding an area whereat microstructures extend from the surface of the component.
10. Method, according to claim 9, further comprising:
    providing an outer dam on the surface of the component, said outer dam surrounding said inner dam.
11. Apparatus for applying a layer of flowable coating material to a surface of an electronic component, comprising:
    means for supporting an electronic component at an end of an arm of a centrifuge such that a surface of an electronic component is normal to a force "F1" acting on the electronic component when the centrifuge is rotating; and
    means for dispensing a flowable coating material on to the surface of the electronic component.
12. Apparatus, according to claim 11, wherein:
    the flowable coating material is spin-on glass.
13. Apparatus, according to claim 11, wherein:
    the means for dispensing is a reservoir having an opening, an orifice disposed above the bottom of the reservoir, and a piping system communicating the flowable coating material from the reservoir to the surface of the electronic component when the centrifuge arm is rotating.
14. Apparatus, according to claim 11, further comprising:
    means for imparting a rotational force "F2" which is parallel to the surface of the electronic component to the electronic component.
15. Apparatus, according to claim 14, wherein:
    the means for imparting the rotational force "F2" is an annular projection engaging a spindle extending from the means for supporting.
16. Apparatus, according to claim 11, wherein:
    the means for supporting is a basket hanging from a pivot point at the end of the arm. annular projection engaging a spindle extending from the means for supporting.

* * * * *